(12) United States Patent
Liu et al.

(10) Patent No.: US 6,339,025 B1
(45) Date of Patent: Jan. 15, 2002

(54) METHOD OF FABRICATING A COPPER CAPPING LAYER

(75) Inventors: Chih-Chien Liu, Taipei; Kun-Chih Wang, Taoyuan; Wen-Yi Hsieh, Hsinchu; Yimin Huang, Taichung Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/304,436

(22) Filed: Apr. 3, 1999

(51) Int. Cl.⁷ ..................... H01L 21/44; H01L 21/4763
(52) U.S. Cl. ................. 438/687; 438/622; 438/618; 438/627; 438/628; 438/630; 438/654; 438/655
(58) Field of Search ................... 438/687, 686, 438/622, 625, 626, 627, 628, 629, 630, 631, 635, 636, 642, 643, 644, 645, 647, 652, 653, 654, 655, 656, 672, 675, 680, 682, 778, 791, 618

(56) References Cited

U.S. PATENT DOCUMENTS 5,447,887 A * 9/1995 Fillipiak et al. ............ 438/644

* cited by examiner

*Primary Examiner*—Charles Bowers
*Assistant Examiner*—Thanhha Pham

(57) ABSTRACT

A method of fabricating a copper capping layer. A silicon rich nitride layer is formed on an exposed copper layer. Since the silicon rich nitride layer has more dangling bonds inside, the silicon in the silicon rich nitride layer easily reacts with the copper and a copper silicide layer is formed between the copper and the silicon rich nitride layer. Therefore, adhesion of the copper and the silicon rich nitride layer can be improved.

24 Claims, 1 Drawing Sheet

METHOD OF FABRICATING A COPPER CAPPING LAYER

BACKGROUND OF THE INVENTION

1. Field of the Invention

The invention relates to a method of fabricating a copper capping layer, and more particularly to a method of fabricating a copper capping layer, thereby improving adhesion between copper and dielectrics.

2. Description of the Related Art

Due to their high degree of conductivity, aluminum and aluminum alloy have been important as conductive materials in the development of the integrated circuit (IC). However, integration of semiconductors has rapidly increased, and the conductivity of aluminum and aluminum alloy can no longer satisfy the speed requirements for semiconductor devices. Therefore, copper is gradually replacing aluminum as a conductive material, because of copper's lower resistance. In additional, copper is more resistant than aluminum to electromigration, and therefore, the trend in the semiconductor industry is to use copper as a conductive material.

Although copper has the advantages as described above, copper still readily diffuses into dielectrics, and diffuses especially easily into silicon dioxide. Diffusion of copper into dielectrics causes electrical shorts; it is therefore necessary to form a barrier layer between copper and dielectrics. In the conventional process, a tantalum/tantalum nitride layer is usually formed on the bottom and sidewalls of the copper interconnect in order to prevent copper from diffusing into the surrounding silicon dioxide. A silicon nitride layer is typically used to cap the copper interconnect. The silicon nitride layer functions as a protective layer for the silicon dioxide layer formed in subsequent processes and reduces probabilities that copper might diffuse into the dielectrics. However, the silicon nitride layer adheres poorly to copper, which causes the silicon nitride to easily peel away from the copper, creating a path for copper to diffuse outward and for moisture or other contaminates to diffuse inward.

SUMMARY OF THE INVENTION

Therefore, the invention is directed towards a method of fabricating a copper capping layer. A silicon rich nitride (SRN) layer is formed on a copper layer, which is exposed. Since there are more dangling bonds in the SRN layer, the silicon in the dangling bonds inside the SRN layer react with the copper layer to form a copper silicide between the SRN layer and the copper layer. Adhesion between the SRN layer and copper is enhanced and, therefore, peeling of the SRN layer from the copper layer is avoided, thereby increasing reliability of devices.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
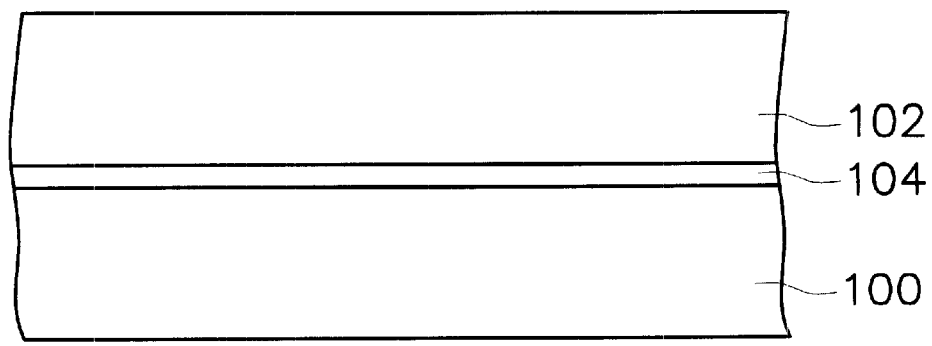
FIG. 1 is a schematic, cross-sectional view illustrating fabrication of a copper capping layer.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, a silicon rich nitride layer 102 serving as a capping layer is deposited on copper 100 to prevent from diffusion of copper into the overhead dielectrics (not shown). Since the SRN layer 102 has more dangling bonds, such as Si—H, the silicon atoms in the dangling bonds react with copper 100 to form a copper silicide layer 104, $CuSi_2$, for example, between copper 100 and the SRN layer 102 during the deposition of SRN layer 102. Adhesion between copper 100 and the SRN layer 104 is improved by the formation of the copper silicide layer 104, the stress therebetween is released and the peeling effect can be eliminated.

The SRN layer 102 can be formed by plasma enhanced chemical vapor deposition (PECVD) using a gas source at least containing silane ($SiH_4$) and ammonia ($NH_3$), for example, where the ambient temperature is less than about 450° C. The hydrogen atoms in plasma react with the unsaturated Si bond to form dangling Si—H bonds and accordingly, the number of Si—H bonds in SRN layer 12 increases. In order to raise the silicon component in the SRN layer 102, it is necessary to adjust the silane/ammonia ratio, which gases are introduced into the chamber. Therefore, the preferred stoichiometry of N/Si in SRN layer 102 can be less than 1, and the reflective index of the SRN layer 102 is larger than 2.0.

Figure 2A:
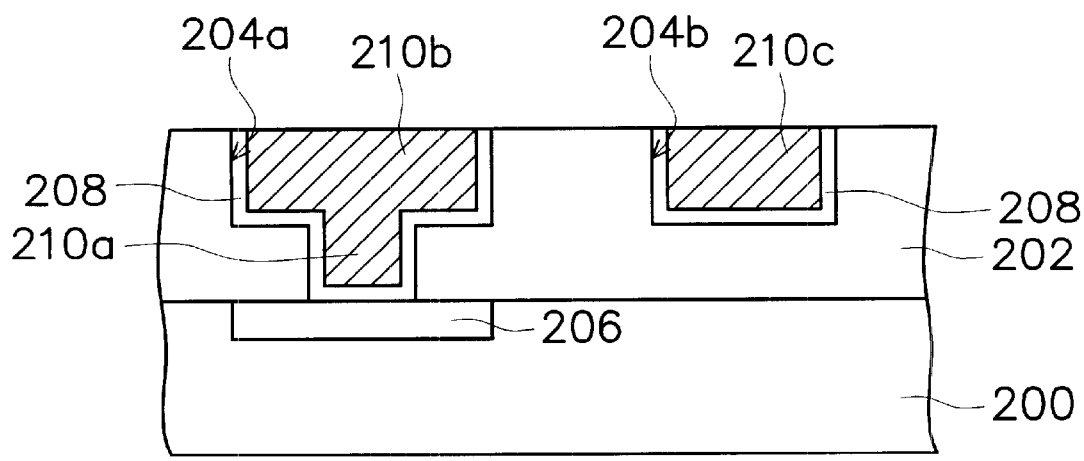
FIGS. 2A–2B are schematic, cross-sectional views illustrating fabrication of a copper capping layer on a copper interconnect.
Figure 2B:
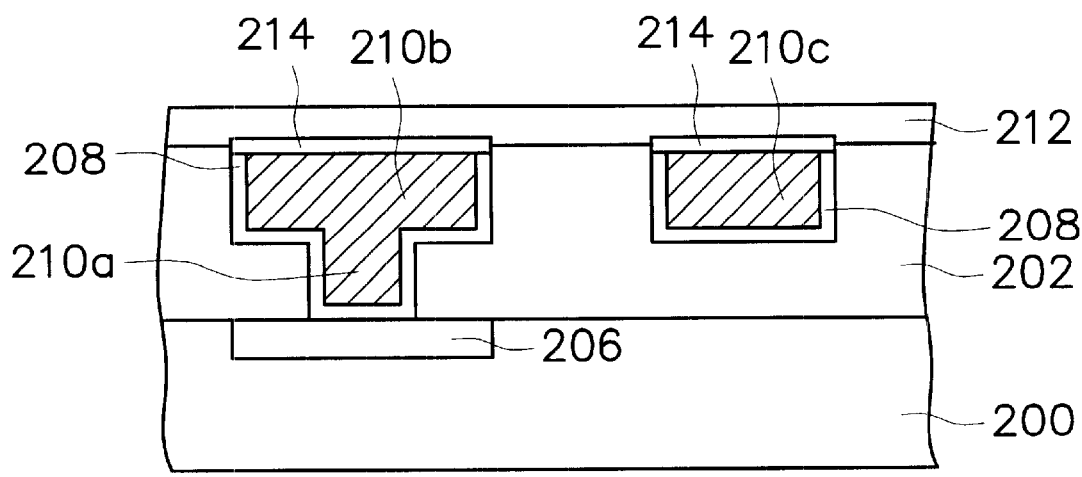

FIGS. 2A–2B illustrate the fabrication of a capping layer on wiring lines. As shown in FIG. 2A, a dielectric layer 202 is formed on the semiconductor substrate 200 having device structures, such as gate. The dielectric layer 202 includes a silicon dioxide layer, phosphosilicate glass (PSG), boronphosphosilicate glass (BPSG), or the like, for example, and can be formed by chemical vapor deposition (CVD). An opening 204a and a trench 204b are formed within the dielectric layer 202 by a method such as dual damascene. After the formation of the opening 204a and the trench 204b, an active region 206 within the semiconductor substrate 200 such as a conductive layer or a doped region is exposed.

Referring to FIG. 2A again, a barrier layer 208 is formed on the bottom and the sidewall of the opening 204a and the trench 204b. The barrier layer 208 can be titanium/titanium nitride or tantalum/tantalum nitride, for example, and is formed by sputtering. The formation of the barrier layer 208 blocks copper from being diffused into surrounding dielectric layer 202 and adhesion between copper and dielectrics can be improved. Copper is then formed to fill the opening 204a and the trench 204b. The copper filling the lower and upper parts of the opening 204a respectively serves as a metallic plug 210a and a wiring line 210b, and additionally, the trench 204b filled with copper is used for a wiring line 210c. After the opening 204a and the trench 204b are filled with copper, chemical mechanical polishing (CMP) is carried out to remove residual copper and barrier layer 208 from the dielectric layer 202. The dielectric layer 202 is thus exposed, and the wiring lines 210b, 210c are substantially level with the dielectric layer 202.

Referring to FIG. 2B, a silicon rich nitride (SRN) layer 212 is formed on the dielectric layer 202 by plasma enhanced chemical vapor deposition. Silane and ammonium are used as a deposition gas source, and by adjusting the ratio of the flow rate of silane/ammonium, the component of silicon in SRN layer 212 is more than the nitrogen component. Since the SRN layer 212 has more Si—H dangling bonds inside, the Si—H bonds react with the copper to result in a copper silicide layer 214 formed between the exposed copper 210b, 210c and the SRN layer 212. The existence of the copper silicide layer 214 enhances adhesion of copper 210b, 210c and the SRN layer 212. Therefore, the SRN layer 212 does not peel away from the copper due to stress, and, as a result, the SRN layer 212 can really function as a capping layer.

This invention applies not only to wiring lines but also in some situations where copper is exposed and a capping layer is necessary. Such situation includes a barrier layer on wiring lines, a metallic plug, an interconnect and between copper and dielectrics, for example. Copper in this invention can be formed by deposition, selective deposition or electroplating, and the semiconductor device on the substrate includes gate, multi-level interconnects or the like.

In a word, this invention is to provide a silicon rich nitride layer on an exposed copper surface. A copper silicide layer is formed between the copper and the silicon rich nitride layer during the deposition of the silicon rich nitride layer. Therefore, the silicon rich nitride layer can be used as a capping layer because the copper silicide layer ensures the adhesion therebetween, thereby improving the reliability of the device.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a capping layer, comprising:
   providing a copper layer; and
   forming a silicon rich nitride layer on the copper layer;
   wherein a copper silicide layer is formed between the copper layer and the silicon rich layer while forming the silicon rich nitride layer.

2. The method according to claim 1, wherein a gas source for forming the silicon rich nitride at least includes silane and ammonia.

3. The method according to claim 1, wherein the copper silicide layer is formed by reacting the silicon rich nitride layer with the copper layer.

4. The method according to claim 1, wherein a reflective index of the silicon rich nitride layer is larger than 2.

5. The method according to claim 1, wherein the silicon rich nitride layer is formed by plasma enhanced chemical vapor deposition.

6. The method according to claim 1, wherein silane is used as a gas source for forming the silicon rich nitride layer.

7. The method according to claim 1, wherein ammonia is used as a gas source for forming the silicon rich nitride layer.

8. A method of fabricating a wiring line, comprising:
   providing a semiconductor substrate having a dielectric layer thereon;
   forming an opening within the dielectric layer;
   forming a copper layer in the opening to expose a portion of the copper layer;
   forming a silicon rich nitride layer on the copper layer and the dielectric layer; and
   forming a copper silicide layer between the copper layer and the silicon rich nitride layer while forming the silicon rich nitride layer.

9. The method according to claim 8, wherein the copper silicide layer is formed by a reaction between the copper layer and the silicon rich nitride.

10. The method according to claim 8, wherein a gas source for forming the silicon rich nitride layer at least includes silane and ammonia.

11. The method according to claim 8, wherein before forming the copper layer further comprises a step of forming a barrier layer between the copper and the dielectric layer.

12. The method according to claim 11, wherein the barrier layer includes Ta/TaN.

13. The method according to claim 8, wherein a reflective index of the silicon rich nitride layer is larger than 2.

14. The method according to claim 8, wherein the silicon rich nitride layer is formed by plasma enhanced chemical vapor deposition.

15. The method according to claim 8, wherein silane is used as a gas source for forming the silicon rich nitride layer.

16. The method according to claim 8, wherein ammonia is used as a gas source for forming the silicon rich nitride layer.

17. A method of fabricating a semiconductor device, comprising:
   providing a semiconductor substrate having a dielectric layer thereon;
   forming a copper layer within the dielectric layer such that a portion of the copper layer is exposed; and
   forming a silicon rich nitride layer having Si-H bonds on the copper layer and the dielectric layer;
   wherein the step of forming the silicon rich nitride layer further comprises:
   forming a copper silicide layer by reacting the Si-H bonds in the silicon rich nitride with the copper.

18. The method according to claim 17, wherein a gas source for forming the silicon rich nitride layer at least includes silane and ammonia.

19. The method according to claim 17, wherein before forming the copper layer further comprises a step of forming a barrier layer between the copper and the dielectric layer.

20. The method according to claim 19, wherein the barrier layer includes Ta/TaN.

21. The method according to claim 17, wherein a reflective index of the silicon rich nitride layer is larger than 2.

22. The method according to claim 17, wherein the silicon rich nitride layer is formed by plasma enhanced chemical vapor deposition.

23. The method according to claim 17, wherein silane is used as a gas source for forming the silicon rich nitride layer.

24. The method according to claim 17, wherein ammonia is used as a gas source for forming the silicon rich nitride layer.

* * * * *